Figure 1:
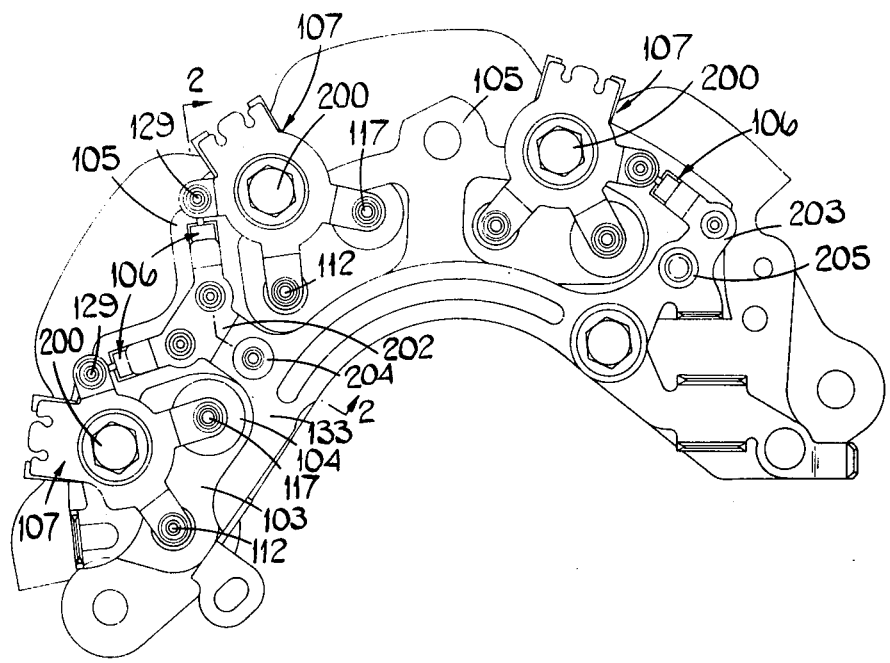

United States Patent [19]

Moore

[11] 4,137,560
[45] Jan. 30, 1979

[54] MULTIPHASE FULL-WAVE RECTIFIER ASSEMBLY

[75] Inventor: Alan R. Moore, Walsall, England

[73] Assignee: Lucas Industries Limited, Birmingham, England

[21] Appl. No.: 908,139

[22] Filed: May 22, 1978

[30] Foreign Application Priority Data

Oct. 29, 1977 [GB] United Kingdom ............... 45151/77

[51] Int. Cl.² ............................................. H02M 7/06
[52] U.S. Cl. ................................... 363/145; 310/68 D
[58] Field of Search ............. 310/68 D; 363/144, 145, 363/146

[56] References Cited

U.S. PATENT DOCUMENTS

| 3,777,193 | 12/1973 | Buehner | 363/145 X |
| 3,870,944 | 3/1975 | Ogawa et al. | 310/68 D X |
| 3,927,338 | 12/1975 | Vieilleribiere | 363/144 X |
| 4,065,686 | 12/1977 | Moore | 363/145 X |

Primary Examiner—William M. Shoop

Attorney, Agent, or Firm—Olson, Trexler, Wolters, Bushnell & Fosse, Ltd.

[57] ABSTRACT

A multiphase full-wave rectifier assembly comprises positive and negative plates and an electrically insulating body which are stacked together in spaced apart relationship. The positive and negative plates carry first and second sets of three power diodes respectively while the electrically insulating body has three recesses therein. A field diode is mounted in each recess and a respective electrical connector connects one terminal of each field diode with a respective terminal of one of the power diodes in each of the first and second sets. A common electrical connector mounted on the body serves to interconnect the other terminals of the field diodes and also has portions which engage against the bodies of the field diodes to hold the latter in their respective recesses. The common connector is secured to the electrically insulating body by means of rivets which are disposed adjacent the diode-engaging portion of the common connector.

5 Claims, 2 Drawing Figures

MULTIPHASE FULL-WAVE RECTIFIER ASSEMBLY

This invention relates to a multiphase full-wave rectifier assembly.

In our German Offenlegungsschrift No. 2656447, there is described, a multiphase, full-wave rectifier assembly, comprising a first plate, a second plate substantially parallel to the first plate, first and second sets of diodes carried by the first and second plates respectively, terminals of the first set of diodes extending through holes in the second plate, a connector electrically interconnecting said terminals of each diode of the first set with a respective diode of the second set, a support structure in the form of an electrically insulating body having recesses therein, a further set of diodes disposed respectively in said recesses, said recesses being shaped so as to hold the diodes of the further set in predetermined relative positions, one of the terminals of each diode of the first set being electrically connected with a respective one of the connectors, and a common connector connecting together the other terminals of the diodes of the further set.

In a specific example of such a rectifier assembly construction, we disclosed a two-part support structure comprising a first moulding having said recesses therein and an electrically insulating cover having portions overlying said recesses, said portions of the cover being shaped to prevent disengagement of the diodes of the further set from the recesses but to permit the terminals of the diodes of the first set to project from the body.

It has been found that the overall number of parts can be reduced if the common connector is shaped so that portions thereof overlie said recesses in the electrically insulating body so that the diodes of the further set are retained in said recesses by said portions of the common connector.

In an alternative embodiment, instead of portions of the common connector overlying the recesses to retain the diodes of the further set in position, portions of the connector which interconnect the terminals of the first, second and further sets of diodes are arranged for this purpose.

The above form of construction obviates the need to provide a separate electrically insulating cover such as the cover 127 disclosed in our German Offenlegungsschrift No. 2656447.

Figure 2:
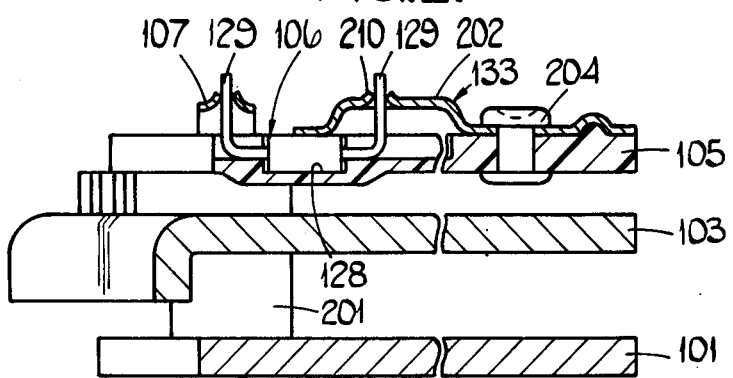

An embodiment of the present invention will now be described, by way of example, with reference to the accompanying drawings in which:

FIG. 1 is a plan view of a multiphase full-wave rectifier assembly according to one embodiment of the present invention, for mounting on a motor vehicle alternator, and FIG. 2 is a section on the line 2—2 of FIG. 1.

Referring to the drawing, the multiphase full-wave rectifier assembly illustrated therein is similar to that disclosed in our German Offenlegungsschrift No. 2656447 and similar parts are accorded the same reference numerals. Briefly, the assembly comprises a negative plate 101 carrying three power diodes (not shown), a positive plate 103 carrying another three power diodes 104, an electrically insulating body 105 carrying a further three diodes 106, which are field diodes, three metal connectors 107 and a common electrical connector 133. The plates 101 and 103, and the body 105 are stacked one on top of the other so that the plates 101 and 103 are in spaced apart relationship. Mounting bolts 200 and insulating bushes 201 (only one shown — FIG. 2) serve to maintain the plates 101 and 103 in spaced apart relationship and the bolts 200 also serve to secure the metal connectors 107 in position. The metal connectors 107 electrically interconnect respective terminals 112, 117 and 129 of the diodes on the negative plate 101, the diodes 104 and the positive plate 103, and the diodes 106 carried by the body 105.

The other terminals of the diodes on the negative plate 101 are electrically connected therewith. The other terminals of the diodes 104 are electrically connected with the positive plate 103 and the other terminals 129 of the diodes 106 are electrically connected with the common electrical connector 133.

In the place of the electrically insulating cover 127 described in our German Offenlegungsschrift No. 2656447, the common electrical connector 133 is provided with a generally Y-shaped portion 202 at one end thereof and a generally L-shaped portion 203, at the other end thereof, said portions 202 and 203 being integral with the remainder of the common connector 133. Each short limb of the Y-shaped portion 202 holds a respective one of the diodes 106 within a respective recess 128 in the electrically insulating body 105. Similarly, the shorter limb of the L-shaped portion 203 of the common connector 133 holds the remaining diode 106 in a corresponding recess 128 in the electrically insulating body 105. As will be apparent from FIG. 2, the recesses 128 are of a shape such as to hold the terminals 129 in the diodes 106 in the required orientation. Flexing of the Y-shaped portion 202 and L-shaped portion 203 is prevented by the provision of respective rivets 204 and 205 which serve to secure said portions 202 and 203 firmly against the body 105 in the region at which said portions 202 and 203 are joined with the remainder of the common connector 133. As can be seen particularly in FIG. 2, the Y-shaped portion 202 is cranked upwardly beyond the rivet 204 before being cranked downwardly to engage against the respective diodes 106. As can also be seen from FIG. 2, the respective terminals 129 pass through plunged holes 210 formed in a part of the Y-shaped portion 202 which is spaced away from the body 105. The L-shaped portion 203 is similarly cranked. Such a cranked arrangement of the portions 202 and 203 permits the connections with the respective terminals 129 to be at the same level as the other connections to be made between the other terminals 129, 117 and 112 and the connectors 107. This enables all of the connections to be soldered by means of a flow soldering operation.

The above form of multiphase full-wave rectifier assembly is easier to assemble than the assembly described in our German Offenlegungsschrift No. 2656447 and, like the latter assembly, serves to hold the field diodes 106 in the recesses 128 both prior and subsequent to the above-mentioned flow soldering operation, whereby, in service, the diodes 106 are firmly held against unwanted vibration.

Other advantages of the above-described rectifier assembly over that disclosed in our German Offenlegungsschrift No. 2656447 are as follows:

1. The whole assembly, and particularly the field diodes, operates at a lower temperature in view of improved access to heat generating parts by cooling air.

2. Because the field diodes are held by individual parts rather than trapped by a common part, the field diodes can be held more effectively in position. This results in an improved performance in service because of the reduced risk of vibration of the field diodes.

3. Apart from being easier to assemble, the above-described assembly is cheaper because it uses less parts.

4. A greater flexibility of design is permitted.

I claim:

1. A multiphase, full-wave rectifier assembly, comprising a first plate, a second plate substantially parallel to the first plate, first and second sets of diodes carried by the first and second plates respectively, terminals of the first set of diodes extending through holes in the second plate, connector electrically interconnecting said terminals of each diode of the first set with a respective diode of the second set a support structure in the form of an electrically insulating body having recesses therein, a further set of diodes disposed respectively in said recesses, said recesses being shaped so as to hold the diodes of the further set in predetermined relative positions, one of the terminals of each diode of the first set being electrically connected with a respective one of the connectors, and a common connector connecting together the other terminals of the diodes of the further set, wherein the common connector is shaped so that portions thereof overlie said recesses in the electrically insulating body so that the diodes of the further set are retained in said recesses by said portions of the common connector.

2. An assembly as claimed in claim 1, modified so that instead of portions of the common connector overlying the recesses to retain the diodes of the further set in position, portions of the connector which interconnect the terminals of the first, second and further sets of diodes overlie the recesses for this purpose.

3. An assembly as claimed in claim 1, wherein each portion of the common connector which overlies a respective one of the recesses is integrally joined to the remainder of the common connector by a respective joining portion to which said other terminal of the respective diode of the further set is attached.

4. An assembly as claimed in claim 3, wherein the joining portions are co-planar and spaced away from the electrically insulating body.

5. An assembly as claimed in claim 3 or 4, wherein the common connector is secured to the electrically insulating body by fixing means which are adjacent the joining portions and disposed on the opposite sides of the latter to the recess-overlying portions of the common connector.

* * * * *